United States Patent
Kim

(10) Patent No.: US 9,543,333 B2
(45) Date of Patent: Jan. 10, 2017

(54) DISPLAY APPARATUS

(71) Applicant: SAMSUNG DISPLAY CO., LTD., Yongin, Gyeonggi-Do (KR)

(72) Inventor: Hyuntae Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/627,867

(22) Filed: Feb. 20, 2015

(65) Prior Publication Data

US 2016/0079280 A1 Mar. 17, 2016

(30) Foreign Application Priority Data

Sep. 15, 2014 (KR) .................. 10-2014-0122044

(51) Int. Cl.
*H01L 27/15* (2006.01)
*H01L 27/12* (2006.01)

(52) U.S. Cl.
CPC .................... *H01L 27/124* (2013.01)

(58) Field of Classification Search
None
See application file for complete search history.

(56) References Cited

U.S. PATENT DOCUMENTS

| | | | | |
|---|---|---|---|---|
| 7,279,708 B2 * | 10/2007 | Kwak | .................. | H01L 27/124 257/59 |
| 8,362,483 B2 * | 1/2013 | Kim | .................. | H01L 22/32 257/48 |
| 8,835,927 B2 * | 9/2014 | Chang | .................. | H01L 33/08 257/59 |
| 2010/0020256 A1 * | 1/2010 | Lee | .................. | G02F 1/136209 349/39 |
| 2010/0283955 A1 | 11/2010 | Kim et al. | | |
| 2013/0093654 A1 | 4/2013 | Park et al. | | |
| 2013/0161661 A1 * | 6/2013 | Akamatsu | .............. | H01L 27/15 257/88 |
| 2015/0129880 A1 * | 5/2015 | Wu | .................. | H01L 27/124 257/72 |

FOREIGN PATENT DOCUMENTS

| KR | 10-2006-0033831 A | 4/2006 |
|---|---|---|
| KR | 10-2006-0102172 A | 9/2006 |
| KR | 10-2006-0135182 A | 12/2006 |
| KR | 10-2010-0121893 A | 11/2010 |
| KR | 10-2013-0041575 A | 4/2013 |

* cited by examiner

*Primary Examiner* — Ali Naraghi
(74) *Attorney, Agent, or Firm* — Lee & Morse, P.C.

(57) ABSTRACT

A display apparatus including a display area on a substrate, the display area including at least a display device; and a non-display area adjacent to the display area, wherein the non-display area includes a pull-in area, the pull-in area includes a wiring unit that includes a plurality of wires electrically connected to the display device of the display area, and a conductive pattern unit that is electrically connected to the display device and that includes at least one area separated from and overlapping the wiring unit, and the plurality of wires of the wiring unit are not arranged in parallel such that respective angles between an edge of the display area and at least two of the plurality of wires are different.

20 Claims, 13 Drawing Sheets

DISPLAY APPARATUS

CROSS-REFERENCE TO RELATED APPLICATION

Korean Patent Application No. 10-2014-0122044, filed on Sep. 15, 2014, in the Korean Intellectual Property Office, and entitled: "Display Apparatus," is incorporated by reference herein in its entirety.

BACKGROUND

1. Field

Embodiments relate to a display apparatus.

2. Description of the Related Art

Recently, display apparatuses have been variously used. Also, the display apparatuses have become thin and light, and thus a usage range thereof tends to be widened.

For example, the display apparatuses tend to be replaced by a portable thin-film flat panel display apparatus.

The display apparatuses may include a display area that emits one or more visible rays to produce an image visible to a user. The display area may include one or more wires for facilitating the emission of the visible rays.

The display apparatuses may include a non-display area, other than the display area, for various purposes, e.g., an area which does not emit the visible rays when the user watches the display apparatuses. The non-display area may include one or more wires connected to the display area.

SUMMARY

Embodiments are directed to a display apparatus.

The embodiments may be realized by providing a display apparatus including a display area on a substrate, the display area including at least a display device; and a non-display area adjacent to the display area, wherein the non-display area includes a pull-in area, the pull-in area includes a wiring unit that includes a plurality of wires electrically connected to the display device of the display area, and a conductive pattern unit that is electrically connected to the display device and that includes at least one area separated from and overlapping the wiring unit, and the plurality of wires of the wiring unit are not arranged in parallel such that respective angles between an edge of the display area and at least two of the plurality of wires are different.

The respective angles between the edge of the display area and the plurality of wires may gradually decrease in a direction along the edge of the display area.

The conductive pattern unit may overlap the plurality of wires, and a height of one area of the conductive pattern unit may be different from a height of another area of the conductive pattern unit.

The plurality of wires of the wiring unit may include a first wire and a second wire, an angle between the first wire and the edge of the display area may be greater than an angle between the second wire and the edge of the display area, and a height of an area of the conductive pattern unit that overlaps the first wire may be greater than a height of an area of the conductive pattern unit that overlaps the second wire.

The conductive pattern unit may have a stair-step shaped edge such that heights of the conductive pattern unit gradually decrease in a direction along the edge.

Heights of the conductive pattern unit may gradually decrease.

A length of an area of the first wire that overlaps the conductive pattern unit may be substantially equal to a length of an area of the second wire that overlaps the conductive pattern unit.

The display apparatus may further include an insertion conductive pattern between the wiring unit and the conductive pattern unit.

A height of an area of the insertion conductive pattern that overlaps the plurality of wires may be different from a height of another area of the insertion conductive pattern that overlaps the plurality of wires.

A height of an area of the conductive pattern that overlaps the wiring unit may be substantially constant.

The plurality of wires of the wiring unit may include a first wire and a second wire, a length of an area of the first wire that overlaps the conductive pattern unit may be smaller than a length of an area of the second wire that overlaps the conductive pattern unit, and a height of an area of the insertion conductive pattern that overlaps the first wire may be greater than a height of an area of the insertion conductive pattern that overlaps the second wire.

The insertion conductive pattern may have a stair-step shaped edge such that heights of the insertion conductive pattern gradually decrease in a direction along the edge.

The insertion conductive pattern may gradually decrease in height in a direction.

An angle between the first wire and the edge of the display area may be greater than an angle between the second wire and the edge of the display area.

The display apparatus may further include insulating layers between the wiring unit and the insertion conductive pattern and between the insertion conductive pattern and the conductive pattern unit.

Gaps may be respectively formed between the conductive pattern unit and the plurality of wires of the wiring unit in areas where the plurality of wires overlap the conductive pattern unit, and respective sizes of at least two of the gaps between the plurality of wires and the conductive pattern unit may be different.

The display apparatus may further include intermediate insulating layers between the plurality of wires and the conductive pattern unit, wherein sizes of the gaps between the plurality of wires and the conductive pattern unit correspond to thicknesses of the intermediate insulating layers.

The plurality of wires may include a first wire and a second wire, a length of an area of the first wire that overlaps the conductive pattern unit may be smaller than a length of an area of the second wire that overlap the conductive pattern unit, and a thickness of an area of the intermediate insulating layer where the first wire overlaps the conductive pattern unit may be smaller than a thickness of an area of the intermediate insulating layer where the second wire overlaps the conductive pattern unit.

The intermediate insulating layers may include a single layer or multiple layers in each of the areas where the plurality of wires overlap the conductive pattern unit.

The display device may be connected to at least a power supply line, a scan line, and a data line, and the plurality of wires and the conductive pattern unit may be each electrically connected to at least one of the power supply line, the scan line, and the data line.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
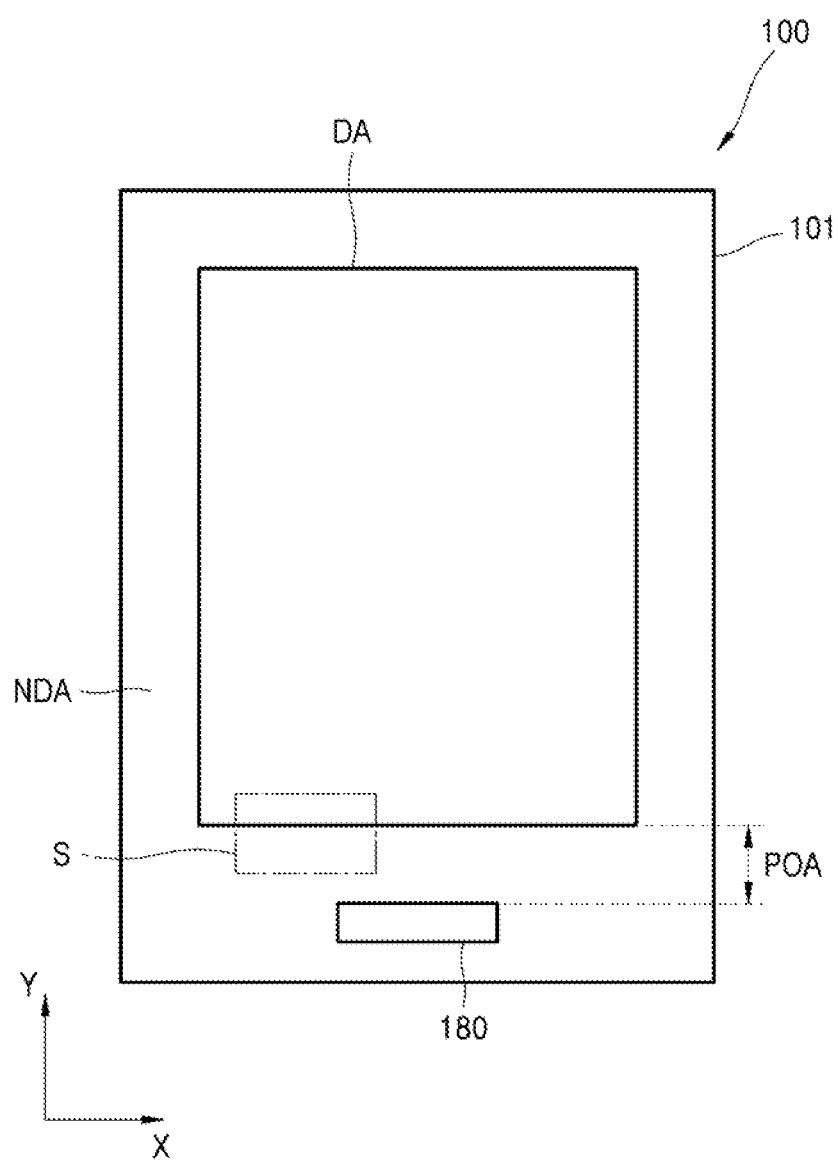
FIG. 1 illustrates a schematic plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

While such terms as "first", "second", etc., may be used to describe various components, such components must not be limited to the above terms. The above terms are used only to distinguish one component from another.

An expression used in the singular encompasses the expression of the plural, unless it has a clearly different meaning in the context.

It will be further understood that the terms "includes," "including," "comprises" and/or "comprising" used herein specify the presence of stated features or components, but do not preclude the presence or addition of one or more other features or components.

It will be understood that when a layer, region, or component is referred to as being "on" or "formed on" another layer, region, or component, it can be directly or indirectly formed on the other layer, region, or component. For example, intervening layers, regions, or components may be present.

In the following description, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
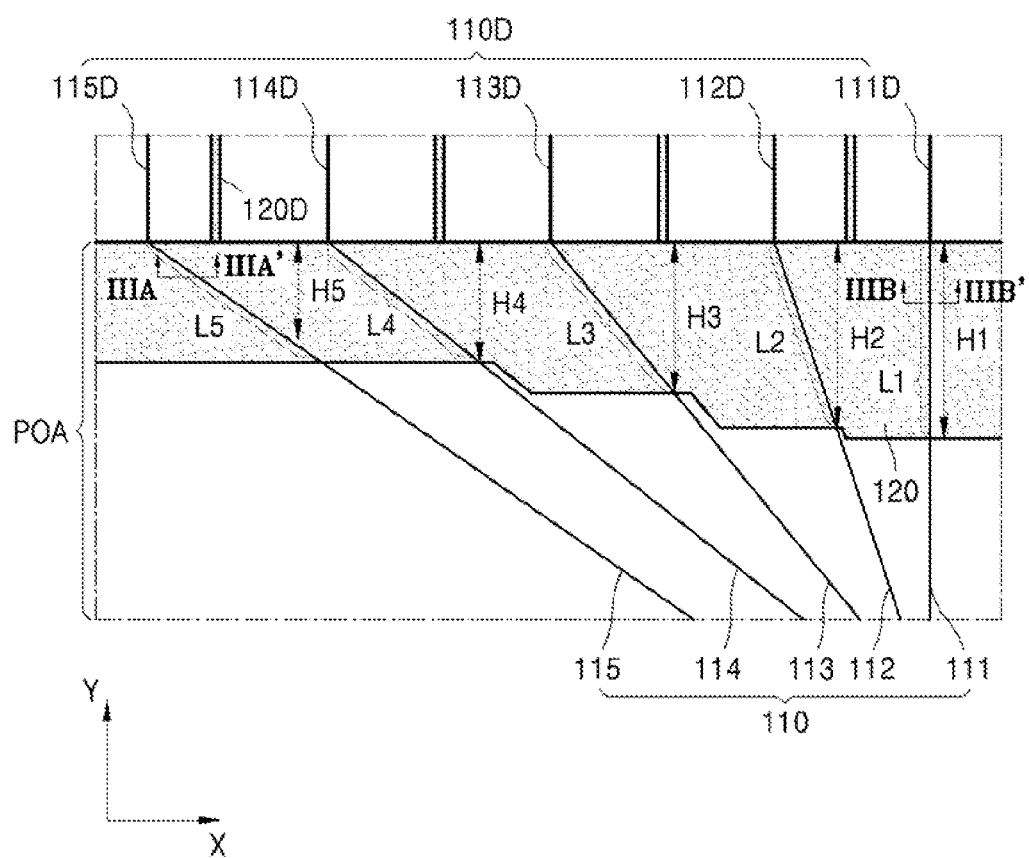
FIG. 2 illustrates an enlarged view of an area S of FIG. 1.
Figure 3:
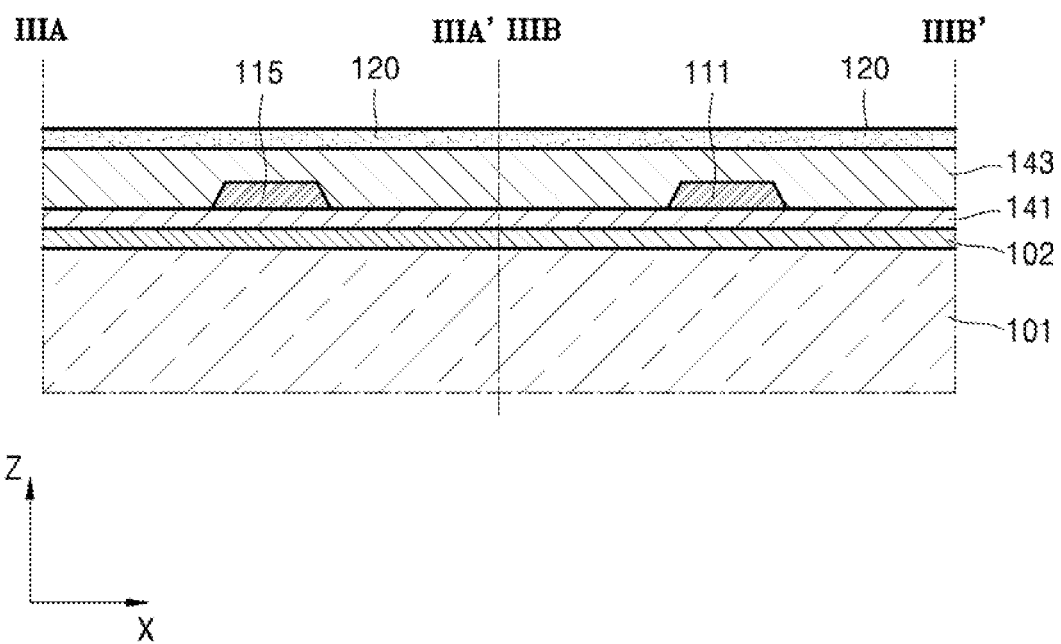
FIG. 3 illustrates a cross-sectional view taken along lines IIIA-IIIA' and IIIB-IIIB' of FIG. 2.

FIG. 1 illustrates a schematic plan view of a display apparatus 100 according to an embodiment. FIG. 2 illustrates an enlarged view of an area S of FIG. 1. FIG. 3 illustrates a cross-sectional view taken along lines IIIA-IIIA' and IIIB-IIIB' of FIG. 2.

The display apparatus 100 may include a display area DA and a non-display area NDA on a substrate 101.

The substrate 101 may include various materials. For example, the substrate 101 may be formed of glass, metals, or organic materials.

In an implementation, the substrate 101 may include a flexible substrate 101. The flexible substrate 101 may be a substrate that has flexibility and is easily bent, curved, folded, or rolled. The flexible substrate 101 may be formed of ultra-thin glass, metals, or plastics. For example, when plastics are used, the substrate 101 may be formed of polyimide PI, or may be formed of various materials.

The display area DA may include one or more display devices (not shown) in order to emit visible rays or light. Types of the display devices may vary. For example, the display device may include an organic light-emitting device. The organic light-emitting device may include a first electrode, a second electrode, and an emission layer disposed between the first electrode and the second electrode.

The non-display area NDA may be arranged adjacent to the display area DA. In an implementation, the non-display area NDA may be arranged to surround the display area DA, as shown in FIG. 1.

In an implementation, the non-display area NDA may be arranged adjacent to a surface of the display area DA.

The non-display area NDA may include a pull-in area POA. The pull-in area POA may be an area of the non-display area NDA that is adjacent to the display area DA. The pull-in area POA may be an area through or at which wires connected to the display area DA pass or are formed.

In an implementation, the display apparatus 100 may include a driving circuit unit 180. The driving circuit unit 180 may include an integrated circuit (IC). In an implementation, the driving circuit unit 180 may transmit electrical signals to the display area DA and/or the driving circuit unit 180 may receive electrical signals from the display area DA.

In an implementation, the pull-in area POA may be arranged in an area of the non-display area NDA between the display area DA and the driving circuit unit 180.

The pull-in area POA will be described in detail with reference to FIG. 2.

A wiring unit 110 and a conductive pattern unit 120 may be arranged in the pull-in area POA.

The wiring unit 110 may include a plurality of wires. For example, the wiring unit 110 may include a first wire 111, a second wire 112, a third wire 113, a fourth wire 114, and a fifth wire 115.

The first wire 111, the second wire 112, the third wire 113, the fourth wire 114, and the fifth wire 115 may extend lengthwise, and one end of each of the first wire 111, the second wire 112, the third wire 113, the fourth wire 114, and the fifth wire 115 may be connected to the display area DA. In an implementation, the first wire 111, the second wire 112, the third wire 113, the fourth wire 114, and the fifth wire 115 may be connected to a first display wiring unit 110D of the display area DA.

For example, the first wire 111 may be connected to a first display wire 111D of the first display wiring unit 110D, and the second wire 112 may be connected to a second display wire 112D of the first display wiring unit 110D. The third wire 113 may be connected to a third display wire 113D of the first display wiring unit 110D, and the fourth wire 114 may be connected to a fourth display wire 114D of the first display wiring unit 110D. The fifth wire 115 may be connected to a fifth display wire 115D of the first display wiring unit 110D.

The first display wiring unit 110D may be or include a wire arranged in the display area DA, and may be or include a wire that is connected to a display device (not shown) in the display area DA. In an implementation, the first display wiring unit 110D may be or include a wire connected to a driving circuit that is necessary for operating the display device, e.g., may facilitate operation of the display device.

In an implementation, the first display wiring unit 110D may be or include a wire connected to various types of thin film transistors (TFTs) (not shown) included in the driving circuit necessary to operate the display area DA, e.g., may be or include a wire connected to a gate electrode of the TFT.

In an implementation, the first display wiring unit 110D may be or include a wire connected to a source electrode or a drain electrode of the TFT.

In an implementation, the first wire 111, the second wire 112, the third wire 113, the fourth wire 114, and the fifth wire 115 of the wiring unit 110 may be spaced apart.

Although not illustrated, in an implementation, one end of each of the first wire 111, the second wire 112, the third wire 113, the fourth wire 114, and the fifth wire 115 of the wiring unit 110 may be electrically connected to the driving circuit unit 180.

The first wire 111, the second wire 112, the third wire 113, the fourth wire 114, and the fifth wire 115 of the wiring unit 110 may not be arranged in parallel. For example, based on an edge of the display area DA (which is adjacent to the wiring unit 110), respective angles between the first wire 111, the second wire 112, the third wire 113, the fourth wire 114, and the fifth wire 115 of the wiring unit 110 and the edge of the display area DA may not be the same. For example, the angles between the first wire 111, the second wire 112, the third wire 113, the fourth wire 114, and the fifth wire 115 of the wiring unit 110 and the edge of the display area DA may differ. For example, the angles between the first wire 111, the second wire 112, the third wire 113, the fourth wire 114, and the fifth wire 115 of the wiring unit 110 and the edge of the display area DA may differ. In an implementation, an angle formed between one of the first wire 111, the second wire 112, the third wire 113, the fourth wire 114, and the fifth wire 115 of the wiring unit 110 and the edge of the display area DA may be different from an angle formed between another of the first wire 111, the second wire 112, the third wire 113, the fourth wire 114, and the fifth wire 115 of the wiring unit 110 and the edge of the display area DA.

In an implementation, the angle between the first wire 111 and the edge of the display area DA may be a right angle (e.g., 90°) or similar or close to a right angle, and the angle between the second wire 112 and the edge of the display area DA may be smaller than the right angle (e.g., may be less than 90°). The angle between third wire 113 and the edge of the display area DA may be smaller than the angle between the second wire 112 and the edge of the display area DA. The angle between the fourth wire 114 and the edge of the display area DA may be smaller than the angle between the third wire 113 and the edge of the display area DA, and the angle between the fifth wire 115 and the edge of the display area DA may be smaller than the angle between the fourth wire 114 and the edge of the display area DA.

The conductive pattern unit 120 may have a pattern that extends in a direction (e.g., in one direction). In an implementation, the conductive pattern unit 120 may overlap with or overlie, and may be separate from the wiring unit 110. The conductive pattern unit 120 may have a pattern that extends to correspond to or overlie the first wire 111, the second wire 112, the third wire 113, the fourth wire 114, and the fifth wire 115 of the wiring unit 110.

The conductive pattern unit 120 may be connected to a wire of the display area DA. In an implementation, the conductive pattern unit 120 may be connected to second display wiring units 120D of the display area DA. For example, an upper surface of the conductive pattern unit 120 may be connected to the second display wiring units 120D.

The second display wiring units 120D may be or include wires arranged in the display area DA and may be or include wires that may be connected to a display device (not shown) formed in the display area DA. For example, the second display wiring units 120D may be or include wires connected to the driving circuit that are necessary to operate the display device, e.g., may facilitate operation of the display device.

In an implementation, the second display wiring units 120D may transmit a power voltage (which may be necessary to operate the display device) to the display area DA.

In an implementation, the second display wiring units 120D may be or include wires connected to various types of TFTs (not shown) included in the driving circuit that are necessary to operate the display area DA.

The conductive pattern unit 120 may overlap or overlie the wiring unit 110, and one or more insulating layers may be arranged therebetween.

Referring to FIG. 3, the first wire 111 and the fifth wire 115 of the wiring unit 110 may be formed on the substrate 101. In an implementation, a buffer layer 102 and a lower insulating layer 141 may be formed between the substrate 101 and the wiring unit 110. In an implementation, the lower insulating layer 141 may be a gate insulating layer.

The conductive pattern unit 120 may be formed on the first wire 111 and the fifth wire 115 of the wiring unit 110, and an intermediate insulating layer 143 may be formed between the first wire 111, the fifth wire 115, and the conductive pattern unit 120.

As shown in FIG. 3, the wiring unit 110 (including the first wire 111 and the fifth wire 115) may overlap with the conductive pattern unit 120, and the intermediate insulating layer 143 may be arranged therebetween. Thus, a capacitance may be generated between the wiring unit 110 and the conductive pattern unit 120.

The conductive pattern unit 120 may have one or more heights H1, H2, H3, H4, and/or H5. For example, the conductive pattern unit 120 may include an area overlapping at least the first wire 111 and that has the height H1, an area overlapping at least the second wire 112 and that has the height H2, an area overlapping at least the third wire 113 and that has the height H3, an area overlapping at least the fourth wire 114 and that has the height H4, and an area overlapping at least the fifth wire 115 and that has the height H2. For example, the height (H1, H2, etc.) may correspond with a distance between an end of the conductive pattern unit 120 that is adjacent to the first display wiring unit 110D (e.g., the edge of the display area DA) and another end of the conductive pattern unit 120 distal to the first display wiring unit 110D.

The heights H1, H2, H3, H4, and H5 of the conductive pattern unit 120 may differ and may have at least two heights that are different from each other. In an implementation, the height H1 may be greater than the height H5.

In an implementation, the height H1 of an area of the conductive unit 120 that overlaps the first wire 111 of the wiring unit 110, e.g., a wire having a near right angle formed between the wire and the edge of the display area DA, may be greater than the height H5 of an area of the conductive unit 120 that overlaps the fifth wire 115 of the wiring unit 110, e.g., a wire having the smallest angle formed between the wire and the edge of the display area DA (from among angles formed between the edge of the display area DA and the first through fifth wires 111 through 115).

In an implementation, the height H1, the height H2, the height H3, the height H4, and the height H5 may gradually decrease, e.g., from one end of the conductive pattern unit 120 toward another end of the conductive pattern unit 120.

In an implementation, the conductive pattern unit 120 may be stair-step shaped. In an implementation, the conductive pattern unit 120 may be roughly stair-step shaped such that parallel sections are connected by inclined sections therebetween.

In an implementation, the conductive pattern unit 120 may not be stair-step shaped but may have a height that gradually changes, e.g., from one end of the conductive pattern unit 120 toward another end of the conductive pattern unit 120.

The first wire 111, the second wire 112, the third wire 113, the fourth wire 114, and the fifth wire 115 of the wiring unit 110 may respectively have lengths L1, L2, L3, L4, and L5 of areas thereof that respectively overlap the conductive pattern unit 120. For example, an area of the first wire 111 that overlaps the conductive pattern unit 120 may have the length L1, and an area of the second wire 112 that overlaps the conductive pattern unit 120 may have the length L2. An area of the third wire 113 that overlaps the conductive pattern unit 120 may have the length L3, and an area of the fourth wire 114 that overlaps the conductive pattern unit 120 may have the length L4. An area of the fifth wire 115 that overlaps the conductive pattern unit 120 may have the length L5.

The lengths L1, L2, L3, L4, and L5 may be similar to each other. In an implementation, the lengths L1, L2, L3, L4, and L5 may be the same.

The display apparatus 100 of the present embodiment may include the wiring unit 110 and the conductive pattern unit 120 in the pull-in area POA. The wiring unit 110 and the conductive pattern unit 120 may be separate from each other and may overlap in at least one area of the pull-in area POA. The insulating layers 143 may be formed between the wiring unit 110 and the conductive pattern unit 120. For example, a capacitance may be generated between the wiring unit 110 and the conductive pattern unit 120.

The wiring unit 110 may be connected to the first display wiring unit 110D of the display area DA, and the conductive pattern unit 120 may be connected to the second display wiring unit 120D of the display area DA. A capacitance generated between each of the first through fifth wires 111 to 115 of the wiring unit 110 and the conductive pattern unit 120 may have an influence on the display area DA.

For example, if the generated capacitances between the first through fifth wires 111 to 115 and the conductive pattern unit 120 were to differ, areas of the display area DA could have non-uniform electrical properties, and thus definition properties of the display area DA could be non-uniform. In the present embodiment, the first through fifth wires 111 to 115 may not be arranged in parallel, e.g., angles between the first through fifth wires 111 to 115 and the edges of the display area DA may be different. Thus, the conductive pattern unit 120 may extend and may have different heights. For example, the conductive pattern unit 120 may be stair-step shaped. Although the first through fifth wires 111 to 115 are not arranged in parallel, the lengths L1, L2, L3, L4, and L5 of areas of the wires 111 to 115, which overlap the conductive pattern unit 120, may be easily controlled. For example, the lengths L1, L2, L3, L4, and L5 may be similarly or identically controlled (e.g., the lengths may be about the same).

Intensities of the capacitances that may be generated between the conductive pattern unit 120 and the wires 111 to 115 may be similarly or identically controlled. As a result, the capacitances that are generated between the conductive pattern unit 120 and the wires 111 to 115 may be uniformly transmitted to the areas of the display area DA. Therefore, the electrical properties of the display apparatus 100 may be improved, and the definition properties thereof may be uniformly implemented.

Figure 4:
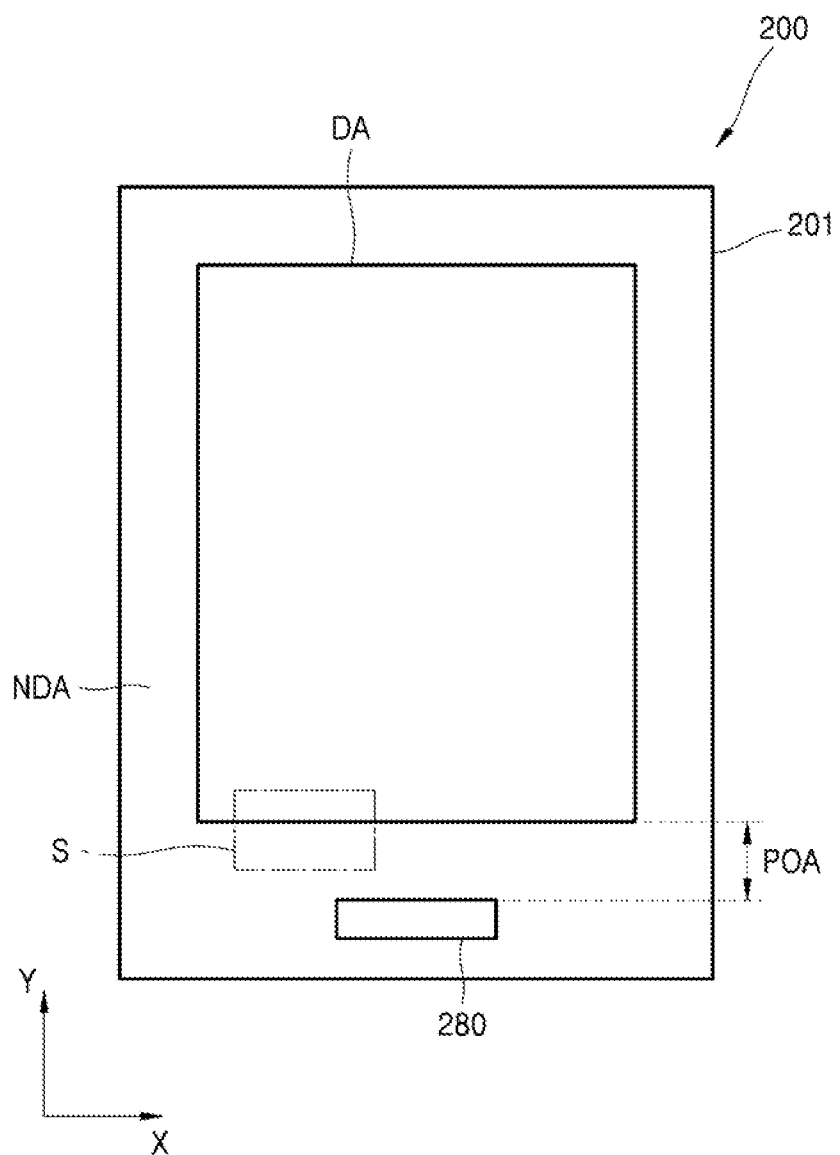
FIG. 4 illustrates schematic plan view of a display apparatus according to another embodiment.
Figure 5:
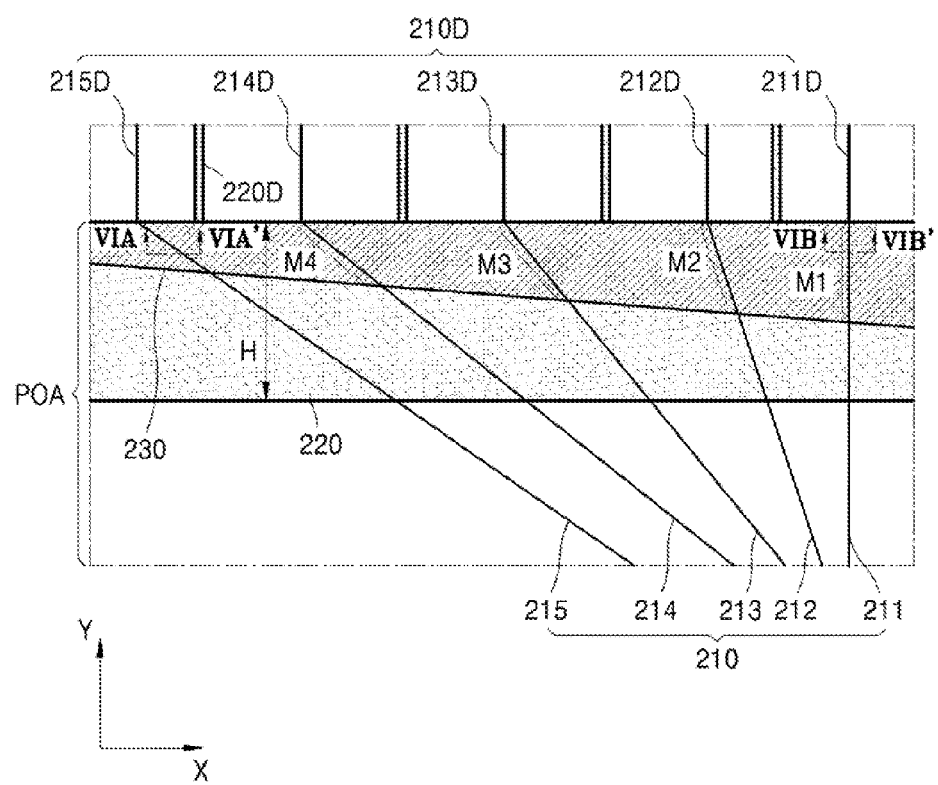
FIG. 5 illustrates an enlarged view of an area S of FIG. 4.
Figure 6:
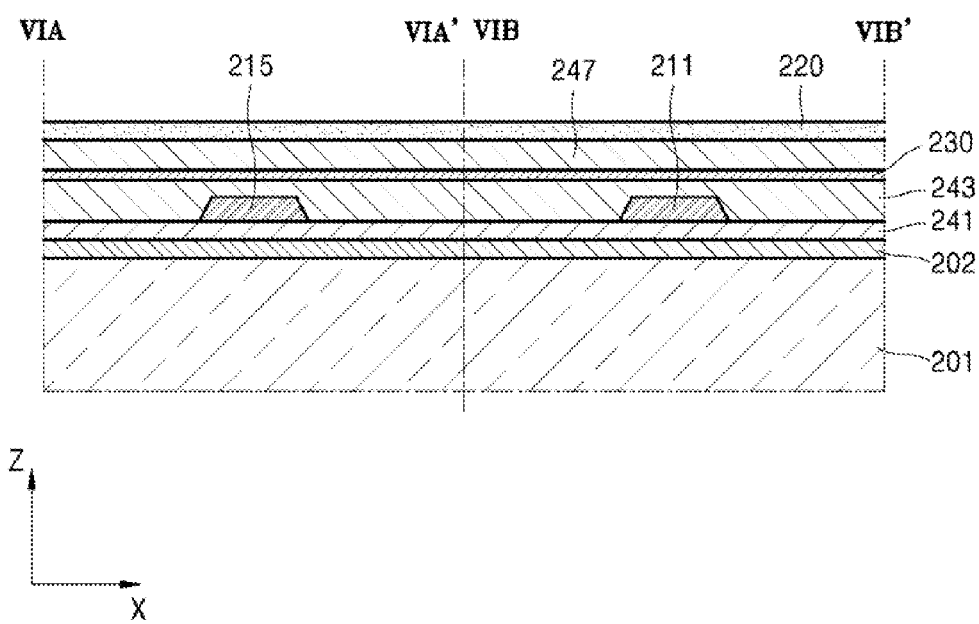
FIG. 6 illustrates a cross-sectional view taken along lines VIA-VIA' and VIB-VIB' of FIG. 5.

FIG. 4 illustrates schematic plan view of a display apparatus 200 according to another embodiment. FIG. 5 illustrates an enlarged view of an area S of FIG. 4. FIG. 6 illustrates a cross-sectional view taken along lines VIA-VIA' and VIB-VIB' of FIG. 5.

The display apparatus 200 may include a display area DA and a non-display area NDA disposed on a substrate 201.

The substrate 201 may be formed of various materials. For example, the substrate 201 may be formed of glass, metals, or other organic materials.

In an implementation, the substrate 201 may include a flexible substrate 201. The flexible substrate 201 may be a substrate that has flexibility and is easily bent, curved, folded, and rolled. The flexible substrate 201 may be formed of ultra-thin glass, metals, or plastics. For example, when plastics are used, the substrate 201 may be formed of PI. In an implementation, the substrate 201 may be formed of various materials.

The display area DA may include one or more display devices (not shown) in order to emit visible rays. Types of the display devices may vary. For example, each display device may include an organic light-emitting device, and the organic light-emitting device may include a first electrode, a second electrode, and an emission layer disposed between the first electrode and the second electrode.

The non-display area NDA may be arranged adjacent to the display area DA. In an implementation, the non-display area NDA may be arranged to surround the display area DA, as shown in FIG. 4.

In an implementation, the non-display area NDA may be arranged adjacent to a surface of the display area DA.

In an implementation, the non-display area NDA may be arranged adjacent to a side of the display area DA.

The non-display area NDA may include a pull-in area POA. The pull-in area POA may be an area of the non-display area NDA that is adjacent to the display area DA. The pull-in area POA may be an area where wires connected to the display area DA are formed or provided.

In an implementation, the display apparatus 200 may include a driving circuit unit 280. The driving circuit unit 280 may include an integrated circuit (IC). In an implementation, the driving circuit unit 280 may transmit electrical signals to the display area DA and/or the driving circuit unit 280 may receive electrical signals from the display area DA.

In an implementation, the pull-in area POA may be arranged in an area of the non-display area NDA that is between the display area DA and the driving circuit unit 280.

The pull-in area POA will be described in detail with reference to FIG. 5.

A wiring unit 210, a conductive pattern unit 220, and an insertion conductive pattern 230 may be arranged in the pull-in area POA.

The wiring unit 210 may include a plurality of wires. For example, the wiring unit 210 includes a first wire 211, a second wire 212, a third wire 213, a fourth wire 214, and a fifth wire 215.

The first wire 211, the second wire 212, the third wire 213, the fourth wire 214, and the fifth wire 215 may extend, and one end of each of the first wire 211, the second wire 212, the third wire 213, the fourth wire 214, and the fifth wire 215 may be connected to the display area DA. In an implementation, the first wire 211, the second wire 212, the third wire 213, the fourth wire 214, and the fifth wire 215 may be connected to the a first display wiring unit 210D of the display area DA.

For example, the first wire 211 may be connected to a first display wire 211D of the first display wiring unit 210D, and the second wire 212 may be connected to a second display wire 212D of the first display wiring unit 210D. The third wire 213 may be connected to a third display wire 213D of the first display wiring unit 210D, and the fourth wire 214 may be connected to a fourth display wire 214D of the first display wiring unit 210D. The fifth wire 215 may be connected to a fifth display wire 215D of the first display wiring unit 210D.

The first display wiring unit 210D may be or may include a wire arranged in the display area DA and may be or include a wire which is connected to a display device (not shown) formed in the display area DA. For example, the first display wiring unit 210D may be or include a wire connected to a driving circuit that is for operation of the display device.

In an implementation, the first display wiring unit 210D may be or include a wire connected to various types of TFT (not shown) of the driving circuit that are for operation of the display area DA, e.g., may be or include a wire connected to a gate electrode of the TFT.

In an implementation, the first display wiring unit 210D may be or include a wire connected to a source electrode or a drain electrode of the TFT.

In an implementation, the first wire 211, the second wire 212, the third wire 213, the fourth wire 214, and the fifth wire 215 may be spaced apart from one another.

Although not illustrated, in an implementation, one end of each of the first wire 211, the second wire 212, the third wire 213, the fourth wire 214, and the fifth wire 215 of the wiring unit 210 may be electrically connected to the driving circuit unit 280.

The first wire 211, the second wire 212, the third wire 213, the fourth wire 214, and the fifth wire 215 of the wiring unit 210 may not be arranged in parallel. For example, based on an edge of the display area DA that is adjacent to the wiring unit 210, respective angles between the first wire 211, the second wire 212, the third wire 213, the fourth wire 214, and the fifth wire 215 of the wiring unit 210 and the edge of the display area DA may not be the same. For example, the angles between the first wire 211, the second wire 212, the third wire 213, the fourth wire 214, and the fifth wire 215 of the wiring unit 210 and the edge of the display area DA may differ. In an implementation, an angle between one of at least two of the first wire 211, the second wire 212, the third wire 213, the fourth wire 214, and the fifth wire 215 of the wiring unit 210 and the edge of the display area DA may be different from an angle between the other of the at least two of the first wire 211, the second wire 212, the third wire 213, the fourth wire 214, and the fifth wire 215 of the wiring unit 210 and the edge of the display area DA.

In an implementation, the angle between the first wire 211 and the edge of the display area DA may be similar or close to a right angle, and the angle between the second wire 212 and the edge of the display area DA may be smaller than the right angle. The angle between third wire 213 and the edge of the display area DA may be smaller than the angle between the second wire 212 and the edge of the display area DA. The angle between the fourth wire 214 and the edge of the display area DA may be smaller than the angle between the third wire 213 and the edge of the display area DA, and the angle between the fifth wire 215 and the edge of the display area DA may be smaller than the angle between the fourth wire 214 and the edge of the display area DA.

The conductive pattern unit 220 may have a pattern that extends in a direction. In an implementation, the conductive pattern unit 220 may overlap and may be separate or spaced apart from the wiring unit 210. The conductive pattern unit 220 may have a pattern that extends to correspond to or overlie the first wire 211, the second wire 212, the third wire 213, the fourth wire 214, and the fifth wire 215 of the wiring unit 210.

The conductive pattern unit 220 may be connected to a wire of the display area DA. In an implementation, the conductive pattern unit 220 may be connected to second display wiring units 220D of the display area DA. For example, an upper surface of the conductive pattern unit 220 may be connected to the second display wiring units 220D.

The second display wiring units 220D may be or include wires arranged in the display area DA and may be or include wires that may be connected to a display device (not shown) of the display area DA. For example, the second display wiring units 220D may be or include wires connected to the driving circuit for operating the display device.

In an implementation, the second display wiring units 220D may transmit a power voltage, which may be used for operating the display device, to the display area DA.

In an implementation, the second display wiring units 220D may be or include a wire connected to various types of TFTs (not shown) of the driving circuit that are for operating the display area DA.

The conductive pattern unit 220 may overlap or overlie the wiring unit 210, and one or more insulating layers may be arranged therebetween.

The conductive pattern unit 220 may have a height H, e.g., a distance from an edge or end of the conductive pattern unit 220 that is adjacent to the display area DA to an edge or end of the conductive pattern unit 220 that is distal to the display area DA. In an implementation, the conductive pattern unit 220 may have the same height in areas corresponding to the first wire 211, the second wire 212, the third wire 213, the fourth wire 214, and the fifth wire 215, e.g., may have the same height H across an entire width thereof.

Thus, respective areas of the first wire 211, the second wire 212, the third wire 213, the fourth wire 214, and the fifth wire 215 of the wiring unit 210, which overlap the conductive pattern unit 220, may have different lengths.

For example, a length of an area of the first wire 211 that overlaps the conductive pattern unit 220 may be smaller than a length of an area of the fifth wire 215 that overlaps the conductive pattern unit 220.

In an implementation, the length of the area of the first wire 211 that overlaps the conductive pattern unit 220 may be smaller than a length of an area of the second wire 212 that overlaps the conductive pattern unit 220. The length of the area of the second wire 212 that overlaps the conductive pattern unit 220 may be smaller than a length of an area of the third wire 213 that overlaps the conductive pattern unit 220. The length of the area of the third wire 213 that overlaps the conductive pattern unit 220 may be smaller than a length of an area of the fourth wire 214 that overlaps the conductive pattern unit 220. The length of the area of the fourth wire 214 that overlaps the conductive pattern unit 220 may be smaller than a length of an area of the fifth wire 215 that overlaps the conductive pattern unit 220.

Accordingly, respective capacitances generated between the first wire 211, the second wire 212, the third wire 213, the fourth wire 214, and the fifth wire 215 of the wiring unit 210 and the conductive pattern unit 220 may differ.

The insertion conductive pattern 230 may be arranged between the wiring unit 210 and the conductive pattern unit 220.

For example, referring to FIG. 6, the first wire 211 and the fifth wire 215 of the wiring unit 210 may be formed on the substrate 201. In an implementation, a buffer layer 202 and a lower insulating layer 241 may be formed between the substrate 201 and the wiring unit 210. In this case, the lower insulating layer 241 may be a gate insulating layer.

The conductive pattern unit 220 may be formed on the first wire 211 and the fifth wire 215 of the wiring unit 210. The insertion conductive pattern 230 may be arranged between the wiring unit 210 and the conductive pattern unit 220.

For example, a first intermediate insulating layer 243 may be formed between the first wire 211 and the insertion conductive pattern 230 and between the fifth wire 215 and the insertion conductive pattern 230. A second intermediate insulating layer 247 may be formed between the insertion conductive pattern 230 and the conductive pattern unit 220.

As shown in FIGS. 5 and 6, the wiring unit 210 may overlap the conductive pattern unit 220, and the first and second intermediate insulating layers 243 and 247 may be arranged therebetween. Thus, a capacitance may be generated between the wiring unit 210 and the conductive pattern unit 220.

Also, the insertion conductive pattern 230 may be formed on the conductive pattern unit 220 and portions of the wiring unit 210. Therefore, capacitances may be generated between the wiring unit 210 and the insertion conductive pattern 230 and between the insertion conductive pattern 230 and the conductive pattern unit 220.

The insertion conductive pattern 230 may extend and may have different heights. Lengths of areas where the insertion conductive pattern 230 overlaps the first through fifth wires 211 through 215 of the wiring unit 210 may differ. For example, a distance between an end of the insertion conductive pattern 230 adjacent to the display area DA and an end of the insertion conductive pattern 230 distal to the display are may be different, e.g., continuously different, along a width of the insertion conductive pattern 230.

In an implementation, a height of an area of the insertion conductive pattern 230 that corresponds to or overlies the first wire 211 may be greater than a height of an area of the insertion conductive pattern 230 that corresponds to or overlies the fifth wire 215.

The first wire 211, the second wire 212, the third wire 213, the fourth wire 214, and the fifth wire 215 of the wiring unit 210 may respectively have lengths M1, M2, M3, M4, and M5 of areas of the insertion conductive pattern 230 that respectively correspond to or overlie the first wire 211, the second wire 212, the third wire 213, the fourth wire 214, and the fifth wire 215 of the wiring unit 210.

For example, an area of the first wire 211 that overlaps the insertion conductive pattern 230 may have the length M1, and an area of the second wire 212 that overlaps the insertion conductive pattern 230 may have the length M2. An area of the third wire 213 that overlaps the insertion conductive pattern 230 may have the length M3, and an area of the fourth wire 214 that overlaps the insertion conductive pattern 230 may have the length M4. An area of the fifth wire 215 that overlaps the insertion conductive pattern 230 may have the length M5.

In an implementation, at least two of the length M1, the length M2, the length M3, the length M4, and the length M5 may be different.

For example, the length M1 may be greater than the length M5.

In an implementation, the length M1, the length M2, the length M3, the length M4, and the length M5 may gradually decrease.

In an implementation, the length M1, the length M2, the length M3, the length M4, and the length M5 may be similar to each other.

The display apparatus 200 of the present embodiment may include the wiring unit 210 and the conductive pattern unit 220 in the pull-in area POA. The wiring unit 210 and the conductive pattern unit 220 may include areas that are separated from each other and that overlap, and one or more insulating layers, e.g., the first and second insulating layers 243 and 247 may be formed between and the wiring unit 210 and the conductive pattern unit 220. For example, a capacitance may be generated between the wiring unit 210 and the conductive pattern unit 220.

The wiring unit 210 may be connected to the first display wiring unit 210D of the display area DA, and the conductive pattern unit 220 may be connected to a second display wiring unit 220D of the display area DA. Respective capacitances generated between the first through fifth wires 211 to 215 of the wiring unit 210 and the conductive pattern unit 220 may affect the display area DA.

For example, if the capacitances generated between the first through fifth wires 211 to 215 of the wiring unit 210 and the conductive pattern unit 220 were to be different from each other, non-uniform electrical properties in each area of the display area DA could result. As a result, the definition properties of the display area DA could be non-uniform.

For example, the capacitance generated between the first wire 211 and the conductive pattern unit 220 could be smaller than that generated between the fifth wire 215 and the conductive pattern unit 220.

The insertion conductive pattern 230 may be arranged between the wiring unit 210 and the conductive pattern unit 220. A height of the insertion conductive pattern 230 may not be constant. For example, a height of an area of the insertion conductive pattern 230 that overlaps the first wire 211 may be greater than a height of an area of the insertion conductive pattern 230 that overlaps the fifth wire 215.

For example, the heights of the insertion conductive pattern 230 may gradually increase or decrease. The lengths M1, M2, M3, M4, and M5 of the areas of the first through fifth wires 211 to 215, which respectively overlap the conductive pattern unit 220, may not be constant.

The length M1 may be greater than, e.g., the length M5. Thus, intensities of the capacitances that may be respectively generated between the insertion conductive pattern 230 and the first through fifth wires 211 to 215 may differ. The capacitance between the insertion conductive pattern 230 and the first wire 211 may be greater than, e.g., the capacitance between the insertion conductive pattern 230 and the fifth wire 215.

As a result, differences between the capacitances that are respectively generated between the conductive pattern unit 220 and the first through fifth wires 211 to 215 of the wiring unit 210 may be compensated with a capacitance between the insertion conductive pattern 230 and the wiring unit 210.

The capacitances between the first through fifth wires 211 to 215 may be uniformly transmitted to the areas of the display area DA. Therefore, the electrical properties of the display apparatus 200 may be improved, and the definition properties of the display apparatus 200 may be easily implemented.

Figure 7:
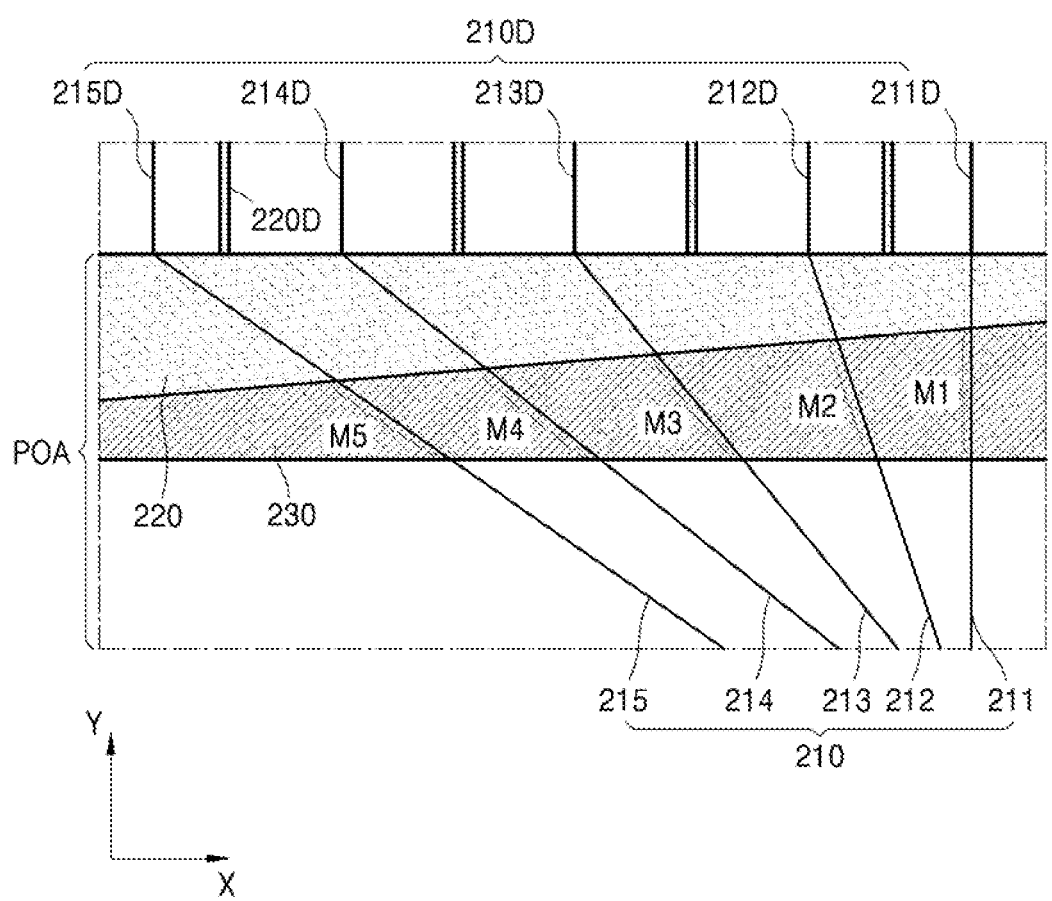
FIGS. 7 and 8 illustrate modified examples of FIG. 5.
Figure 8:
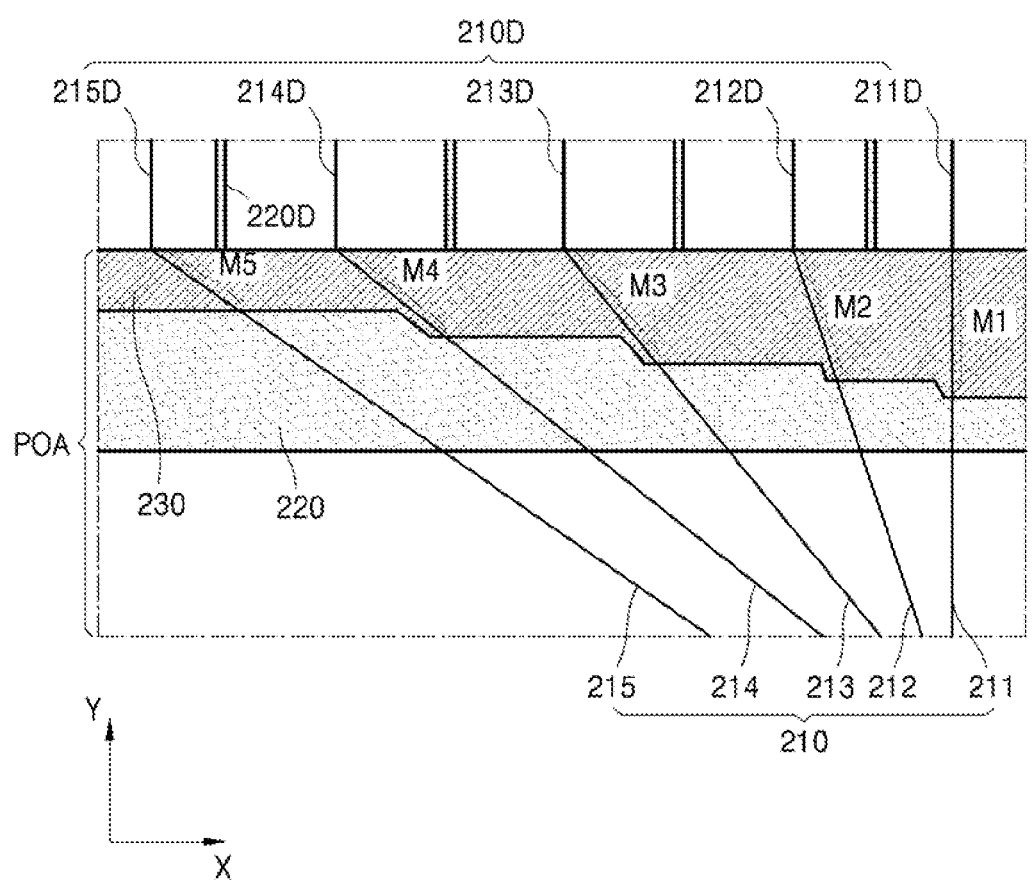

FIGS. 7 and 8 illustrate modified examples of FIG. 5.

As shown in FIG. 7, shapes of the insertion conductive pattern 230 may vary.

The insertion conductive pattern 230 may be variously formed, e.g., in order to non-uniformly form the lengths M1, M2, M3, M4, and M5 of the areas of the first through fifth wires 211 to 215 that respectively overlap the insertion conductive pattern 230, to have the lengths M1, M2, M3, M4, and M5, which gradually decrease, and to make the length M1 be greater than the length M5.

Also, as shown in FIG. 8, the insertion conductive pattern 230 may be stair-step shaped or may have sections with parallel edges connected by sections with inclined edges.

Figure 9:
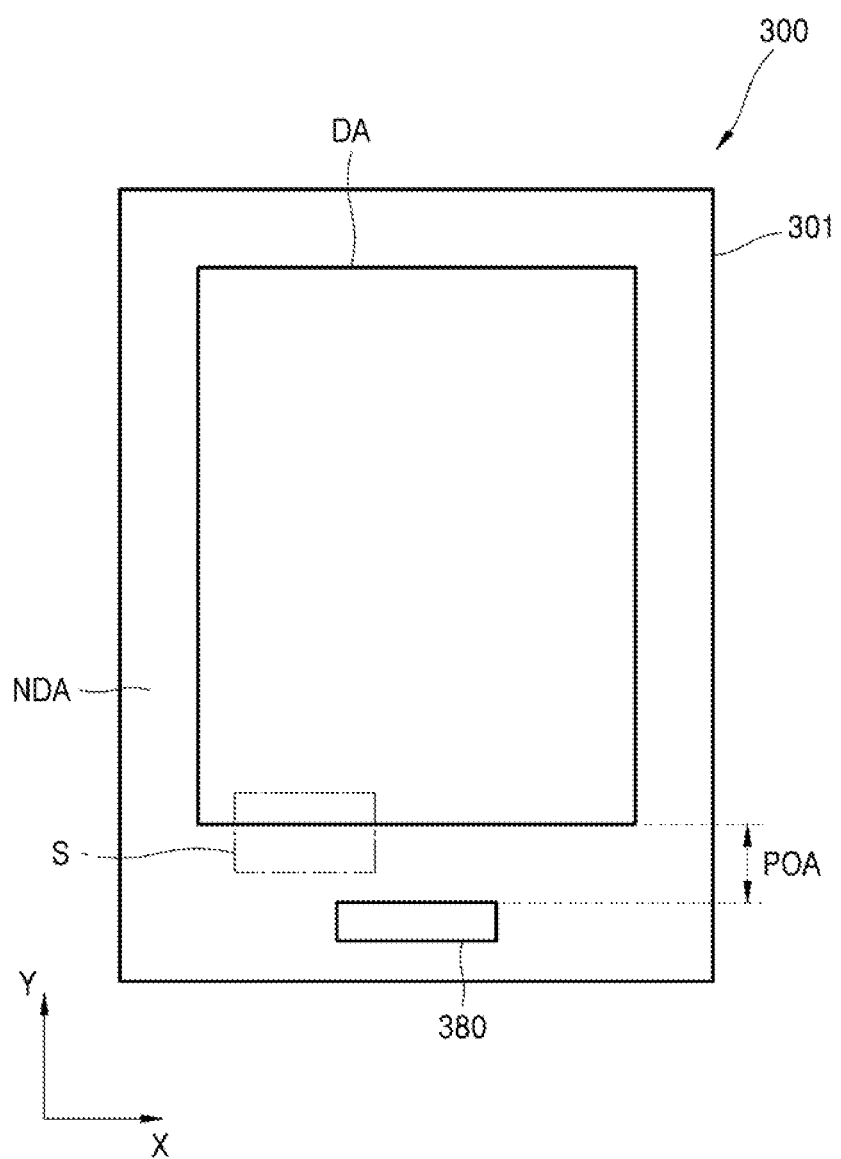
FIG. 9 illustrates a schematic plan view of a display apparatus according to another embodiment.
Figure 10:
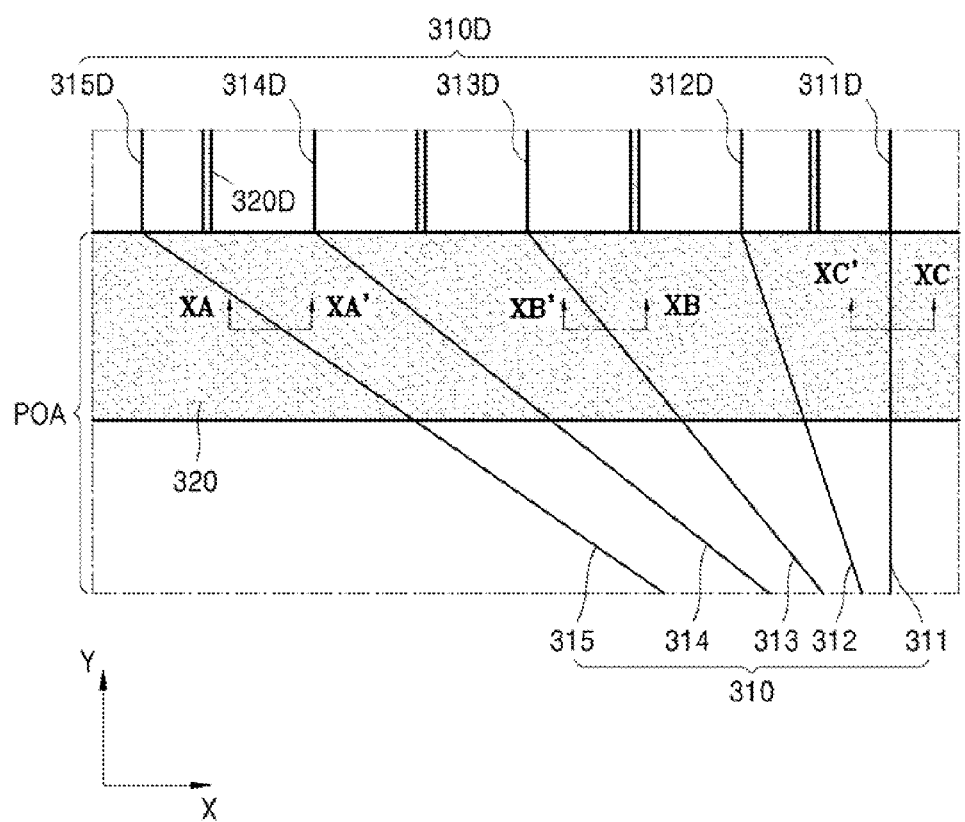
FIG. 10 illustrates an enlarged view of an area S of FIG. 9.
Figure 11:
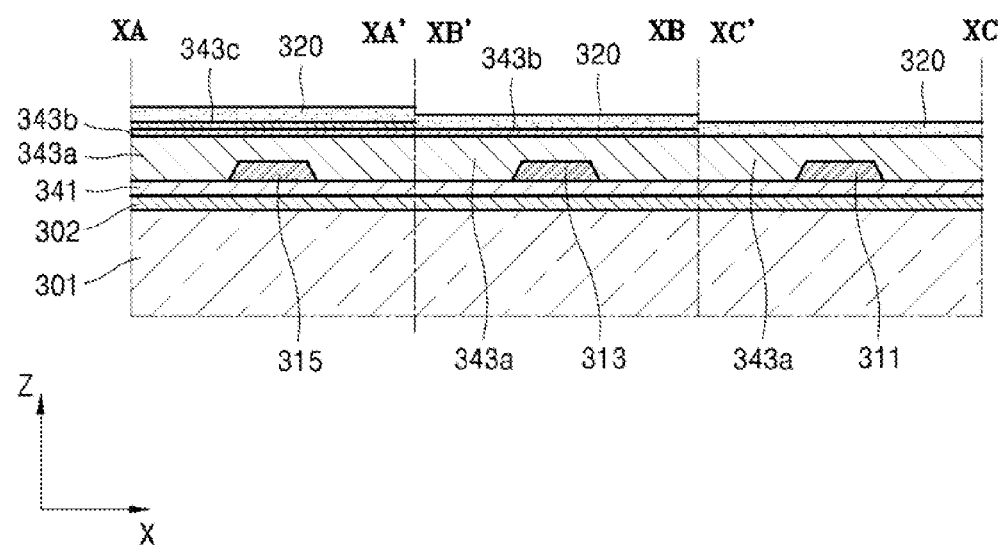
FIG. 11 illustrates a cross-sectional view taken along lines XA-XA' and XB-XB' of FIG. 10.

FIG. 9 illustrates a schematic plan view of a display apparatus 300 according to another embodiment. FIG. 10 illustrates an enlarged view of an area S of FIG. 9. FIG. 11 illustrates a cross-sectional view taken along lines XA-XA' and XB-XB' of FIG. 10.

The display apparatus 300 of the present embodiment may include a display area DA and a non-display area NDA on a substrate 301.

The substrate 301 may be formed of various materials. For example, the substrate 301 may be formed of glass, metals, or other organic materials.

In an implementation, the substrate 301 may include a flexible substrate 301. The flexible substrate 301 may be a substrate that has flexibility and is easily bent, curved, folded, and rolled. The flexible substrate 301 may be formed of ultra-thin glass, metals, or plastics. For example, when plastics are used, the substrate 301 may be formed of PI. In an implementation, the substrate 301 may be formed of various materials.

The display area DA may include one or more display devices (not shown) in order to emit visible rays. Types of the display devices may vary. For example, each display device may include an organic light-emitting device, and the organic light-emitting device may include a first electrode, a second electrode, and an emission layer disposed between the first electrode and the second electrode.

The non-display area NDA may be arranged adjacent to the display area DA. In an implementation, the non-display area NDA may be arranged to surround the display area DA, as shown in FIG. 9.

In an implementation, the non-display area NDA may be arranged adjacent to a surface of the display area DA.

The non-display area NDA may include a pull-in area POA. The pull-in area POA may be an area of the non-display area NDA that is adjacent to the display area DA. The pull-in area POA may be an area where wires connected to the display area DA are formed or provided.

In an implementation, the display apparatus 300 may include a driving circuit unit 380. The driving circuit unit 380 may include an IC. In an implementation, the driving circuit unit 380 may transmit electrical signals to the display area DA and/or the driving circuit unit 380 may receive electrical signals from the display area DA.

In an implementation, the pull-in area POA may be arranged in an area of the non-display area NDA that is disposed between the display area DA and the driving circuit unit 380.

The pull-in area POA will be described in detail with reference to FIG. 10.

A wiring unit 310 and a conductive pattern unit 320 may be arranged in the pull-in area POA.

The wiring unit 310 may include a plurality of wires. For example, the wiring unit 310 may include a first wire 311, a second wire 312, a third wire 313, a fourth wire 314, and a fifth wire 315.

The first wire 311, the second wire 312, the third wire 313, the fourth wire 314, and the fifth wire 315 may extend in a direction, and one end of each of first wire 311, the second wire 312, the third wire 313, the fourth wire 314, and the fifth wire 315 may be connected to the display area DA. In an implementation, the first wire 311, the second wire 312, the third wire 313, the fourth wire 314, and the fifth wire 315 may be connected to the a first display wiring unit 310D of the display area DA For example, the first wire 311 may be connected to a first display wire 311 D of the first display wiring unit 310D, and the second wire 312 may be connected to a second display wire 312D of the first display wiring unit 310D. The third wire 313 may be connected to a third display wire 313D of the first display wiring unit 310D, and the fourth wire 314 may be connected to a fourth display wire 314D of the first display wiring unit 310D. The fifth wire 215 may be connected to a fifth display wire 315D of the first display wiring unit 310D.

The first display wiring unit 310D may be or include a wire arranged in the display area DA and may be or include a wire that is connected to a display device (not shown) of the display area DA. For example, the first display wiring unit 310D may be or include a wire connected to a driving circuit that is for operating the display device.

In an implementation, the first display wiring unit 310D may be or include a wire connected to various types of thin film transistor (TFT) (not shown) of the driving circuit that are for operating the display area DA, e.g., may be or include a wire connected to a gate electrode of the TFT.

In an implementation, the first display wiring unit 310D may be or include a wire connected to a source electrode or a drain electrode of the TFT.

In an implementation, the first wire 311, the second wire 312, the third wire 313, the fourth wire 314, and the fifth wire 315 of the wiring unit 310 may be spaced apart from one another.

Although not illustrated, in an implementation, one end of each of first wire 311, the second wire 312, the third wire 313, the fourth wire 314, and the fifth wire 315 of the wiring unit 310 may be electrically connected to the driving circuit unit 380.

The first wire 311, the second wire 312, the third wire 313, the fourth wire 314, and the fifth wire 315 of the wiring unit 310 may not be arranged in parallel. For example, based on or with respect to an edge of the display area DA adjacent to the wiring unit 310, respective angles between the first wire 311, the second wire 312, the third wire 313, the fourth wire 314, and the fifth wire 315 of the wiring unit 310 and the edge of the display area DA may not be the same. For example, the angles between the first wire 311, the second wire 312, the third wire 313, the fourth wire 314, and the fifth wire 315 of the wiring unit 310 and the edge of the display area DA may differ. In an implementation, an angle between one of at least two of the first wire 311, the second wire 312, the third wire 313, the fourth wire 314, and the fifth wire 315 of the wiring unit 310 and the edge of the display area DA may be different from an angle between the other of the at least two of the first wire 311, the second wire 312, the third wire 313, the fourth wire 314, and the fifth wire 315 of the wiring unit 310 and the edge of the display area DA.

In an implementation, the angle between the first wire 311 and the edge of the display area DA may be similar or close to a right angle, and the angle between the second wire 312 and the edge of the display area DA may be smaller than the right angle. The angle between third wire 313 and the edge of the display area DA may be smaller than the angle between the second wire 312 and the edge of the display area DA. The angle between the fourth wire 314 and the edge of the display area DA may be smaller than the angle between the third wire 313 and the edge of the display area DA, and the angle between the fifth wire 315 and the edge of the display area DA may be smaller than the angle between the fourth wire 314 and the edge of the display area DA.

The conductive pattern unit 320 may have a pattern that extends in a direction. Also, the conductive pattern unit 320 may overlap with and may be separate from the wiring unit 310. The conductive pattern unit 320 may have a pattern that extends to correspond to or overlie the first wire 311, the second wire 312, the third wire 313, the fourth wire 314, and the fifth wire 315 of the wiring unit 310.

The conductive pattern unit 320 may be connected to a wire of the display area DA. In an implementation, the conductive pattern unit 320 may be connected to second display wiring units 320D of the display area DA. For example, an upper surface of the conductive pattern unit 320 may be connected to the second display wiring units 320D.

The second display wiring units 320D may be or include wires arranged in the display area DA and may be or include wires that may be connected to a display device (not shown) in the display area DA. For example, the second display wiring units 320D may be or include wires connected to the driving circuit for operating the display device.

In an implementation, the second display wiring units 320D may transmit a power voltage, which is used for operating the display device, to the display area DA.

In an implementation, the second display wiring units 320D may be or include wires connected to various types of TFTs (not shown) of the driving circuit for operating the display area DA.

The conductive pattern unit 320 may overlap with the wiring unit 310, and one or more insulating layers may be arranged therebetween.

A height of the conductive pattern unit 320 may be constant. For example, a distance between an end of the conductive pattern unit 320 adjacent to the display area DA and an end of the conductive pattern unit 320 distal to the display area DA may be the same along an entire width of the conductive pattern unit. Lengths of areas of the first wire 311, the second wire 312, the third wire 313, the fourth wire 314, and the fifth wire 315, which respectively overlap the conductive pattern unit 320, may be different.

For example, a length of an area of the first wire 311 that overlaps the conductive pattern unit 320 may be smaller than a length of an area of the fifth wire 315 which overlaps the conductive pattern unit 320.

In an implementation, the length of the area of the first wire 311 that overlaps the conductive pattern unit 320 may be smaller than a length of an area of the second wire 312 that overlaps the conductive pattern unit 320. The length of the area of the second wire 312 that overlaps the conductive pattern unit 320 may be smaller than a length of an area of the third wire 313 that overlaps the conductive pattern unit 320, and the length of the third wire 313 that overlaps the conductive pattern unit 320 may be smaller than a length of an area of the fourth wire 314 that overlaps the conductive pattern unit 320. The length of the area of the fourth wire 314 that overlaps the conductive pattern unit 320 may be smaller than a length of an area of the fifth wire 315 that overlaps the conductive pattern unit 320.

Thus, respective capacitances generated between the first wire 311, the second wire 312, the third wire 313, the fourth wire 314, and the fifth wire 315 and the conductive pattern unit 320 may differ.

The conductive pattern unit 320 may overlap the wiring unit 310, and one or more insulating layers may be arranged between the conductive pattern unit 320 and the wiring unit 310.

Referring to FIG. 11, the first wire 311, the third wire 313, and the fifth wire 315 of the wiring unit 310 may be formed on the substrate 301. In an implementation, a buffer layer 302 and a lower insulating layer 341 may be formed between the substrate 301 and the wiring unit 310. In an implementation, the lower insulating layer 341 may be a gate insulating layer.

As shown in FIG. 11 conductive pattern unit 320 may be formed on the first wire 311, the third wire 313, and the fifth wire 315 of the wiring unit 310.

A first intermediate insulating layer 343a may be formed between the first wire 311 and the conductive pattern unit 320. The first intermediate insulating layer 343a and a second intermediate insulating layer 343b may be formed between the third wire 313 and the conductive pattern unit 320. The first intermediate insulating layer 343a, the second intermediate insulating layer 343b, and a third intermediate insulating layer 343c may be formed between the fifth wire 315 and the conductive pattern unit 320.

The display apparatus 300 of the present embodiment may include the wiring unit 310 and the conductive pattern unit 320 in the pull-in area POA. At least one area in the display apparatus 300 may exist in which the wiring unit 310 and the conductive pattern unit 320 overlap and are separate from each other, and a capacitance may be generated between the wiring unit 310 and the conductive pattern unit 320.

The wiring unit 310 may be connected to the first display wiring unit 310D of the display area DA, and the conductive pattern unit 320 may be connected to the second display wiring unit 320D of the display area DA. The capacitances, which may be respectively generated between the first through fifth wires 311 to 315 of the wiring unit 310 between the conductive pattern unit 320, may affect the display area DA.

For example, if the capacitances, which may be respectively generated between the first through fifth wires 311 to 315 of the wiring unit 310 between the conductive pattern unit 320, were to be different from each other, the electrical properties of the display area DA could be non-uniform in each area of the display area DA. Thus, the definition properties of the display area DA could be non-uniform.

For example, the length of the area of the first wire 311, which overlaps the conductive pattern unit 320, may be greater than the length of the area of the fifth wire 315 that overlaps the conductive pattern unit 320. Therefore, the capacitances of the first wire 311 and the fifth wire 315 could be different.

In the present embodiment, the first intermediate insulating layer 343a may be formed between the first wire 311 and the conductive pattern unit 320, and the first intermediate insulating layer 343a, the second intermediate insulating layer 343b, and the third intermediate insulating layer 343c may be formed between the fifth wire 315 and the conductive pattern unit 320. For example, a gap between the first wire 311 and the conductive pattern unit 320 may be smaller than a gap between the fifth wire 315 and the conductive pattern unit 320 (e.g., a distance between the first wire 311 and the conductive pattern unit 320 may be smaller than a distance between the fifth wire 315 and the conductive pattern unit 320). As a result, although the length of the area of the first wire 311 that overlaps the conductive pattern unit 320 may be different from the length of the area of the fifth wire 315 that overlaps the conductive pattern unit 320, a difference between the capacitance generated between the first wire 311 and the conductive pattern unit 320 and the capacitance generated between the fifth wire 315 and the conductive pattern unit 320 may be small. In an implementation, there may be no difference between the capacitance generated between the first wire 311 and the conductive pattern unit 320 and the capacitance generated between the fifth wire 315 and the conductive pattern unit 320.

In an implementation, the first intermediate insulating layer 343a may be formed between the first wire 311 and the conductive pattern unit 320, and the first intermediate insulating layer 343a and the second intermediate insulating layer 343b may be formed between the third wire 313 and the conductive pattern unit 320. In an implementation, first intermediate insulating layer 343a, the second intermediate insulating layer 343b, and the third intermediate insulating layer 343c may be formed between the fifth wire 315 and the conductive pattern unit 320. For example, a distance between the plurality of wires and the conductive pattern unit may correspond to, e.g., may be proportional to or directly proportional to, thicknesses of the intermediate insulating layers.

In an implementation, the intermediate layers may be variously formed so that a gap between the first wire 311 and the conductive pattern unit 320 is smaller than a gap between the third wire 313 and the conductive pattern unit 320, and a gap between the fifth wire 315 and the conductive pattern unit 320 is smaller than the gap between the third wire 313 and the conductive pattern unit 320. In an implementation, as shown in FIG. 11, the intermediate insulating layers, e.g., the first intermediate insulating layer 343a, the second intermediate insulating layer 343b, and the third intermediate insulating layer 343c, may be separately formed, or a single intermediate insulating layer having different thicknesses corresponding to or overlying respective areas of the single intermediate insulating layer may be formed. For example, when the intermediate insulating layers are formed, the thicknesses thereof may be differently controlled by using a half-tone mask.

Although not illustrated, in an implementation, the intermediate insulating layers may be variously formed so that the gap between the first wire 311 and the conductive pattern unit 320 is smaller than a gap between the second wire 312 and the conductive pattern unit 320, and the gap between the second wire 312 and the conductive pattern unit 320 is smaller than the gap between the third wire 313 and the conductive pattern unit 320. The gap between the third wire 313 and the conductive pattern unit 320 may be smaller than a gap between the fourth wire 314 and the conductive pattern unit 320, and the gap between the fourth wire 314 and the conductive pattern unit 320 may be smaller than the fifth wire 315 and the conductive pattern unit 320.

As a result, the capacitances that are generated through the first through fifth wires 311 to 315 may be uniformly transmitted to the areas of the display area DA. Therefore, the electrical properties of the display area 300 may be improved, and the definition properties thereof may be easily implemented.

Figure 12:
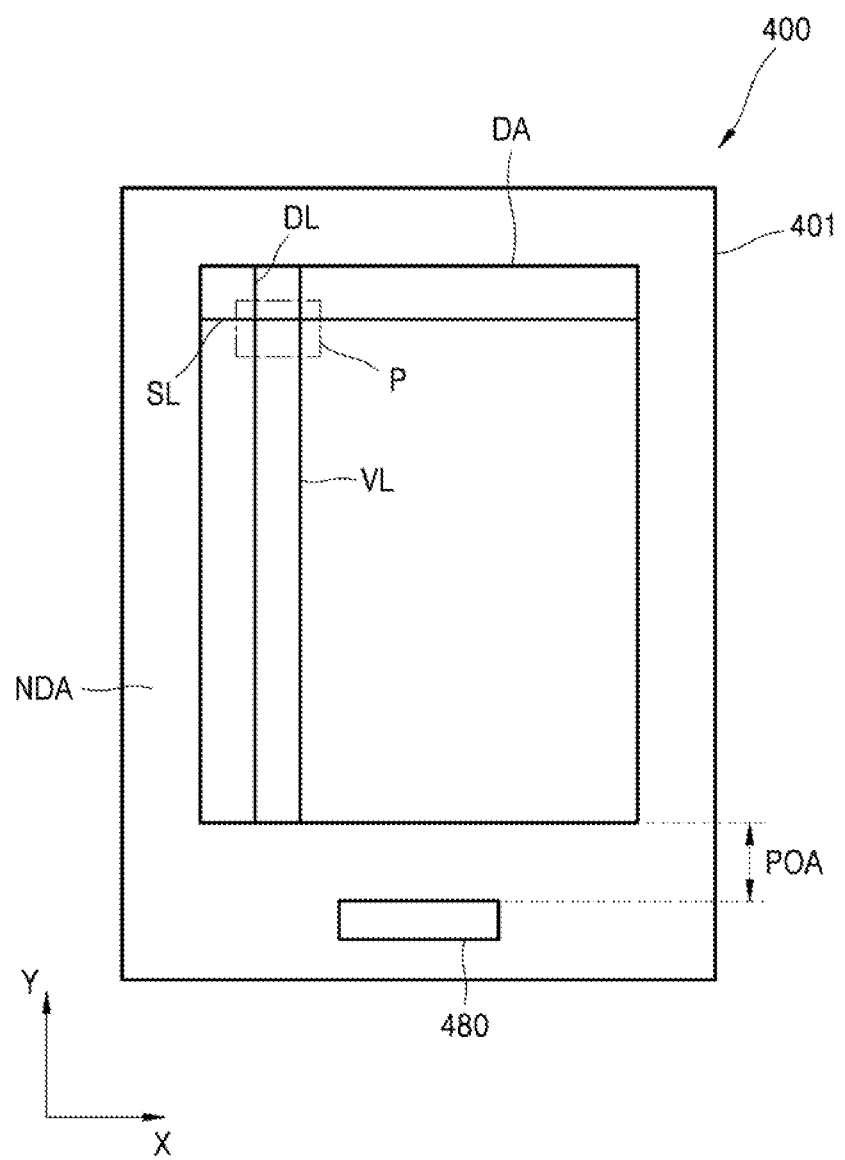
FIG. 12 illustrates a schematic plan view of a display apparatus according to another embodiment.
Figure 13:
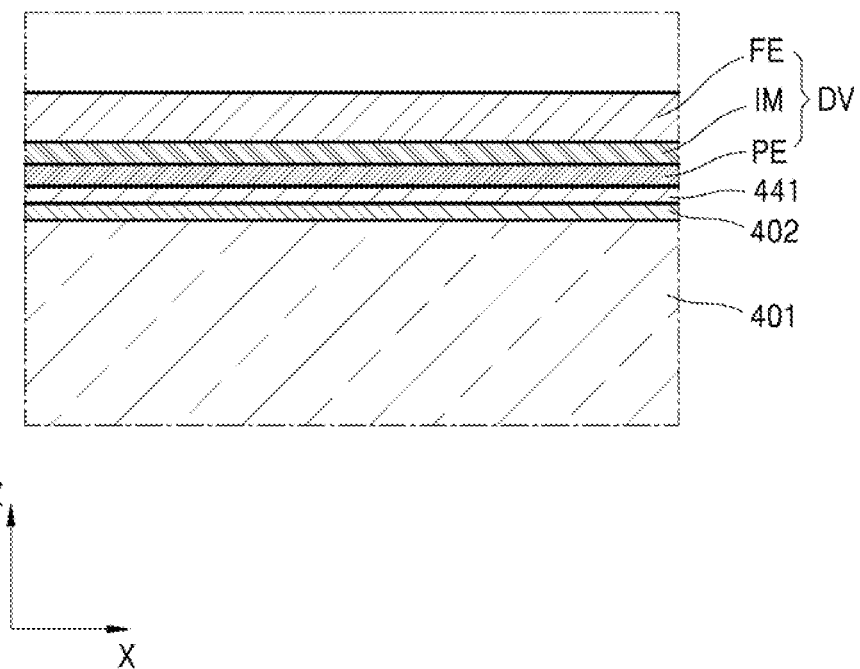
FIG. 13 illustrates a cross-sectional view of an area of a pixel of FIG. 12.

FIG. 12 illustrates a schematic plan view of a display apparatus 400 according to another embodiment, and FIG. 13 illustrates a cross-sectional view of an area of a pixel of FIG. 12.

The display apparatus 400 of the present embodiment may include a display area DA and a non-display area NDA on a substrate 401.

One or more pixels P may be formed on the display area DA. A plurality of wires may be connected to the pixels P. For example, the pixels P may be connected to a scan line SL, which extends in a direction (an X-axis direction of FIG. 12), a data line DL, which extends in a direction (a Y-axis direction of FIG. 12), and a power supply line VL, which extends in a similar direction to the data line DL.

One or more display devices DV may be formed in the pixels P in order to emit visible rays.

For example, as shown in FIG. 13, the display devices DV may be formed on the substrate 401, and the display devices DV may be, e.g., an organic light-emitting device and may include a first electrode PE, a second electrode FE, and an intermediate layer IM. The intermediate layer IM may include at least an emission layer that emits the visible rays.

In an implementation, the first electrode PE may be formed of various materials and may include at least one material selected from the group of transparent conducive oxides such as indium tin oxide (ITO), indium zinc oxide (IZO), zinc oxide (ZnO), indium oxide ($In_2O_3$), indium gallium oxide (IGO), and aluminum zinc oxide (AZO). In an implementation, the first electrode PE may include metals having high reflectivity such as silver (Ag).

The intermediate layer IM may include an emission layer, and the emission layer may be formed of, e.g., a low molecular organic material or a polymer organic material. In an implementation, the intermediate layer IM may further include at least one of a hole injection layer, a hole transport layer, an electron transport layer, and an electron injection layer in addition to the emission layer.

The second electrode FE may be formed of various conductive materials. For example, the second electrode FE may include lithium (Li), calcium (Ca), lithium fluoride (LiF), aluminum (Al), magnesium (Mg) or Ag and may be a single layer or multiple layers formed of at least one of the above-listed materials. The second electrode FE may include alloys containing at least two of the above-listed materials.

In an implementation, a buffer layer 402 and a lower insulating layer 441 may be formed between the substrate 401 and the display device DV. In an implementation, the lower insulating layer 441 may be a gate insulating layer.

Although not illustrated, the display device DV may include a TFT that is electrically connected to the display device DV, and the TFT may be connected to the scan line SL, the data line DL, and the power supply line VL.

The non-display area NDA may include the pull-in area POA. The pull-in area POA may be an area of the non-display area NDA that is adjacent to the display area DA. The pull-in area POA may be an area where a wire connected to the display area DA is formed or provided.

In an implementation, the display apparatus 400 may include a driving circuit unit 480. The driving circuit unit 480 may include an IC. In an implementation, the driving circuit unit 480 may transmit electrical signals to the display area DA and/or may receive electrical signals from the display area DA.

In an implementation, the pull-in area POA may be arranged between an area of the non-display area NDA between the display area DA and the driving circuit unit 480. A wiring unit (not shown) and a conductive pattern unit (not shown) may be formed on the pull-in area POA of the present embodiment. Also, the pull-in area POA of the present embodiment may have the same shape as the pull-in area POA of any one of the display apparatuses 100, 200 and 300 of the previous embodiments.

Thus, repeated descriptions regarding the wiring unit and the conductive pattern unit, an insertion conductive pattern (not shown), and shapes of other intermediate insulating layers may be omitted.

In the display apparatus 400 of the present embodiment, a capacitance generated between the conductive pattern and the wiring unit may be uniformly transmitted to the display area DA, as described above. In an implementation, the capacitance may be uniformly transmitted to each pixel P. Thus, electrical properties of the display apparatus 400 may be improved, and definition properties thereof may be uniformly and easily implemented.

By way of summation and review, interference between the wires, e.g., non-uniform interference between areas, may occur. For example, the interference may electrically affect the display area. As a result, electrical properties of the display area may be degraded, and due to the degradation of the electrical properties of the display area, there may be a limit on improving definition properties of the display apparatuses.

The embodiments may provide a display apparatus having improved electrical and definition properties.

As described above, according to the one or more of the above exemplary embodiments, a display apparatus having improved electrical and definition properties is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a display area on a substrate, the display area including at least a display device; and
   a non-display area adjacent to the display area,
   wherein:
   the non-display area includes a pull-in area,
   the pull-in area includes:
      a wiring unit that includes a plurality of wires electrically connected to the display device of the display area, and
      a conductive pattern unit that is electrically connected to the display device and that includes at least one area separated from and overlapping the wiring unit, and
   the plurality of wires of the wiring unit are not arranged in parallel such that respective angles between an edge of the display area and at least two of the plurality of wires are different.

2. The display apparatus as claimed in claim 1, wherein the respective angles between the edge of the display area and the plurality of wires gradually decrease in a direction along the edge of the display area.

3. The display apparatus as claimed in claim 1, wherein:
   the conductive pattern unit overlaps the plurality of wires, and
   a height of one area of the conductive pattern unit is different from a height of another area of the conductive pattern unit.

4. The display apparatus as claimed in claim 3, wherein:
   the plurality of wires of the wiring unit includes a first wire and a second wire,
   an angle between the first wire and the edge of the display area is greater than an angle between the second wire and the edge of the display area, and
   a height of an area of the conductive pattern unit that overlaps the first wire is greater than a height of an area of the conductive pattern unit that overlaps the second wire.

5. The display apparatus as claimed in claim 4, wherein the conductive pattern unit has a stair-step shaped edge such that heights of the conductive pattern unit gradually decrease in a direction along the edge.

6. The display apparatus as claimed in claim 4, wherein heights of the conductive pattern unit gradually decrease.

7. The display apparatus as claimed in claim 4, wherein a length of an area of the first wire that overlaps the conductive pattern unit is substantially equal to a length of an area of the second wire that overlaps the conductive pattern unit.

8. The display apparatus as claimed in claim 1, further comprising an insertion conductive pattern between the wiring unit and the conductive pattern unit.

9. The display apparatus as claimed in claim 8, wherein a height of an area of the insertion conductive pattern that overlaps the plurality of wires is different from a height of another area of the insertion conductive pattern that overlaps the plurality of wires.

10. The display apparatus as claimed in claim 9, wherein a height of an area of the conductive pattern that overlaps the wiring unit is substantially constant.

11. The display apparatus as claimed in claim 8, wherein:
    the plurality of wires of the wiring unit includes a first wire and a second wire,
    a length of an area of the first wire that overlaps the conductive pattern unit is smaller than a length of an area of the second wire that overlaps the conductive pattern unit, and
    a height of an area of the insertion conductive pattern that overlaps the first wire is greater than a height of an area of the insertion conductive pattern that overlaps the second wire.

12. The display apparatus as claimed in claim 11, wherein the insertion conductive pattern has a stair-step shaped edge such that heights of the insertion conductive pattern gradually decrease in a direction along the edge.

13. The display apparatus as claimed in claim 11, wherein the insertion conductive pattern gradually decreases in height in a direction.

14. The display apparatus as claimed in claim 11, wherein an angle between the first wire and the edge of the display area is greater than an angle between the second wire and the edge of the display area.

15. The display apparatus as claimed in claim 8, further comprising insulating layers between the wiring unit and the insertion conductive pattern and between the insertion conductive pattern and the conductive pattern unit.

16. The display apparatus as claimed in claim 1, wherein:

gaps are respectively formed between the conductive pattern unit and the plurality of wires of the wiring unit in areas where the plurality of wires overlap the conductive pattern unit, and respective sizes of at least two of the gaps between the plurality of wires and the conductive pattern unit are different.

17. The display apparatus as claimed in claim 16, further comprising intermediate insulating layers between the plurality of wires and the conductive pattern unit, wherein sizes of the gaps between the plurality of wires and the conductive pattern unit correspond to thicknesses of the intermediate insulating layers.

18. The display apparatus as claimed in claim 17, wherein:

the plurality of wires includes a first wire and a second wire, a length of an area of the first wire that overlaps the conductive pattern unit is smaller than a length of an area of the second wire that overlap the conductive pattern unit, and a thickness of an area of the intermediate insulating layer where the first wire overlaps the conductive pattern unit is smaller than a thickness of an area of the intermediate insulating layer where the second wire overlaps the conductive pattern unit.

19. The display apparatus as claimed in claim 17, wherein the intermediate insulating layers include a single layer or multiple layers in each of the areas where the plurality of wires overlap the conductive pattern unit.

20. The display apparatus as claimed in claim 1, wherein:

the display device is connected to at least a power supply line, a scan line, and a data line, and the plurality of wires and the conductive pattern unit are each electrically connected to at least one of the power supply line, the scan line, and the data line.

* * * * *